United States Patent
Song et al.

(10) Patent No.: US 9,184,247 B2
(45) Date of Patent: Nov. 10, 2015

(54) POWER SEMICONDUCTOR DEVICE CAPABLE OF MAINTAINING A WITHSTAND VOLTAGE

(71) Applicant: SAMSUNG ELECTRO-MECHANICS CO., LTD., Suwon (KR)

(72) Inventors: In Hyuk Song, Suwon (KR); Kee Ju Um, Suwon (KR); Chang Su Jang, Suwon (KR); Jae Hoon Park, Suwon (KR); Dong Soo Seo, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 94 days.

(21) Appl. No.: 13/795,858

(22) Filed: Mar. 12, 2013

(65) Prior Publication Data

US 2014/0145291 A1    May 29, 2014

(30) Foreign Application Priority Data

Nov. 26, 2012   (KR) .......................... 10-2012-0134700

(51) Int. Cl.
| H01L 29/732 | (2006.01) |
| H01L 29/739 | (2006.01) |
| H01L 29/40  | (2006.01) |
| H01L 29/417 | (2006.01) |
| H01L 29/66  | (2006.01) |
| H01L 29/06  | (2006.01) |

(52) U.S. Cl.
CPC .......... *H01L 29/402* (2013.01); *H01L 29/0619* (2013.01); *H01L 29/41741* (2013.01); *H01L 29/66348* (2013.01); *H01L 29/7397* (2013.01)

(58) Field of Classification Search
CPC ............ H01L 29/0615; H01L 29/1095; H01L 29/0688; H01L 29/7813; H01L 29/7911; H01L 29/7801; H01L 29/0696; H01L 29/7811

USPC .................................................. 257/288, 578
See application file for complete search history.

(56) References Cited

U.S. PATENT DOCUMENTS

| 2009/0008708 A1* | 1/2009 | Arai et al. ..................... 257/330 |
| 2009/0026535 A1* | 1/2009 | Matsuura et al. ............. 257/330 |
| 2011/0180813 A1 | 7/2011 | Harada |

FOREIGN PATENT DOCUMENTS

| JP | 2010-177243 | 8/2010 |
| KR | 10-2012-0121344 | 11/2012 |

OTHER PUBLICATIONS

B. Jayant Baliga, Foundamentals of Power Semiconductor, 2008, Springer, p. 149-155.*
Office action dated Nov. 18, 2013 from corresponding Korean Patent Application No. 10-2012-0134700 and its English summary provided by the clients.

* cited by examiner

*Primary Examiner* — Marcos D Pizarro
(74) *Attorney, Agent, or Firm* — Ladas & Parry, LLP

(57) ABSTRACT

Disclosed herein is a power semiconductor device. The power semiconductor device includes a second conductive type first junction termination extension (JTE) layer that is formed so as to be in contact with one side of the second conductive type well layer, a second conductive type second JTE layer that is formed on the same line as the second conductive type first JTE layer, and is formed so as to be spaced apart from the second conductive type first JTE layer in a length direction of the substrate, and a poly silicon layer that is formed so as to be in contact with the second conductive type well layer and an upper portion of the second conductive type first JTE layer.

9 Claims, 4 Drawing Sheets

POWER SEMICONDUCTOR DEVICE CAPABLE OF MAINTAINING A WITHSTAND VOLTAGE

CROSS REFERENCE TO RELATED APPLICATION

This application claims the benefit of Korean Patent Application No. 10-2012-0134700, filed on Nov. 26, 2012, entitled "Power Semiconductor Device", which is hereby incorporated by reference in its entirety into this application.

BACKGROUND OF THE INVENTION

1. Technical Field

The present invention relates to a power semiconductor device.

2. Description of the Related Art

In a power semiconductor device in addition to US 2011-0180813 A, a termination area is used for the purpose of supporting a withstand voltage by applying a separate structure in order to prevent concentration of an electric field of an active cell edge portion in a high withstand voltage element, and a widely used structure is a ring structure or the ring structure and a poly field plate structure.

The power semiconductor device having the above-described structure is required to secure a wide termination area in order to obtain a required withstand voltage in a method in which P-layers with a predetermined interval therebetween are connected with each other and expansion of a depletion layer is increased when an off mode is operated.

However, the increase in the width of the termination area causes a reduction in an active region having the same chip size when an on mode is operated, to thereby cause an increase in conduction loss, an increase in heat generation of the device, or an increase in production costs due to an increase in a chip size in order to maintain the same active region area.

Therefore, there is a demand for a power semiconductor device that can reduce a size while maintaining a withstand voltage.

PRIOR ART DOCUMENT

Patent Document (Patent Document 1) US 2011-0180813 A

SUMMARY OF THE INVENTION

The present invention has been made in an effort to provide a power semiconductor device that may reduce a size of the device while maintaining a high withstand voltage.

According to an embodiment of the present invention, there is provided a power semiconductor device, including: a first conductive type drift layer that includes one surface and the other surface, and is divided into an active region, a connection region, and a termination region; a second conductive type semiconductor substrate that is formed on the other surface of the first conductive type drift layer; a second conductive type well layer that is formed with a predetermined depth in a thickness direction from the one surface of the first conductive type drift layer, and formed in the active region; a second conductive type first junction termination extension (JTE) layer that is formed so as to be in contact with one side of the second conductive type well layer; a second conductive type second JTE layer that is formed on the same line as the second conductive type first JTE layer, and is formed so as to be spaced apart from the second conductive type first JTE layer in a length direction of the substrate; and a poly silicon layer that is formed so as to be in contact with the second conductive type well layer and an upper portion of the second conductive type first JTE layer.

Here, the second conductive type first JTE layer and the second conductive type second JTE layer may have a concentration lower than the second conductive type well layer.

In addition, the poly silicon layer may be formed so as to be closer to the second conductive type well layer rather than the second conductive type second layer in the length direction of the substrate.

In addition, the power semiconductor device may further include a first insulating layer that is formed so as to be in contact over an area from an upper portion of the second conductive type first JTE layer to an upper portion of the second conductive type second JTE layer. Here, the poly silicon layer may be formed so as to be in contact with the second conductive type well layer and the upper portion of the second conductive type first JTE layer and is formed so as to be in contact with an arbitrary area among a side surface and an upper surface of the first insulating layer.

In addition, the second conductive type second JTE layer may be formed longer than the second conductive type first JTE layer in the length direction of the substrate.

In addition, the power semiconductor device may further include a trench that is formed so as to pass through the second conductive type well layer in a thickness direction from one surface of the first conductive type drift layer while including the second conductive type well layer.

In addition, the power semiconductor device may further include a second insulating layer that is formed on the second conductive type well layer and the second conductive type first JTE layer while including an inner side surface of the trench.

In addition, the power semiconductor device may further include a second electrode region that is formed on the second conductive type well layer and formed on both outer walls of the trench; a third insulating layer that includes an upper portion of the trench of one surface of the first conductive type drift layer and the poly silicon layer spaced apart from the upper portion of the trench in the length direction of the substrate, and includes an opening portion for forming the first electrode on the first insulating layer; and a second electrode that includes a third insulating layer on the upper portion side of the trench and is formed on the one surface of the first conductive type drift layer.

In addition, the power semiconductor device may further include a first electrode that includes an opening portion for forming the first electrode of the third insulating layer, and is formed on an arbitrary area of an upper portion of the third insulating layer.

In addition, the power semiconductor device may further include a third electrode that is formed on a lower surface of the second conductive type semiconductor substrate.

In addition, the power semiconductor device may further include a first conductive type buffer layer that is formed between the first conductive type drift layer and the second conductive type semiconductor substrate.

In addition, the first conductive type may be an N-type, and the second conductive type may be a P-type.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
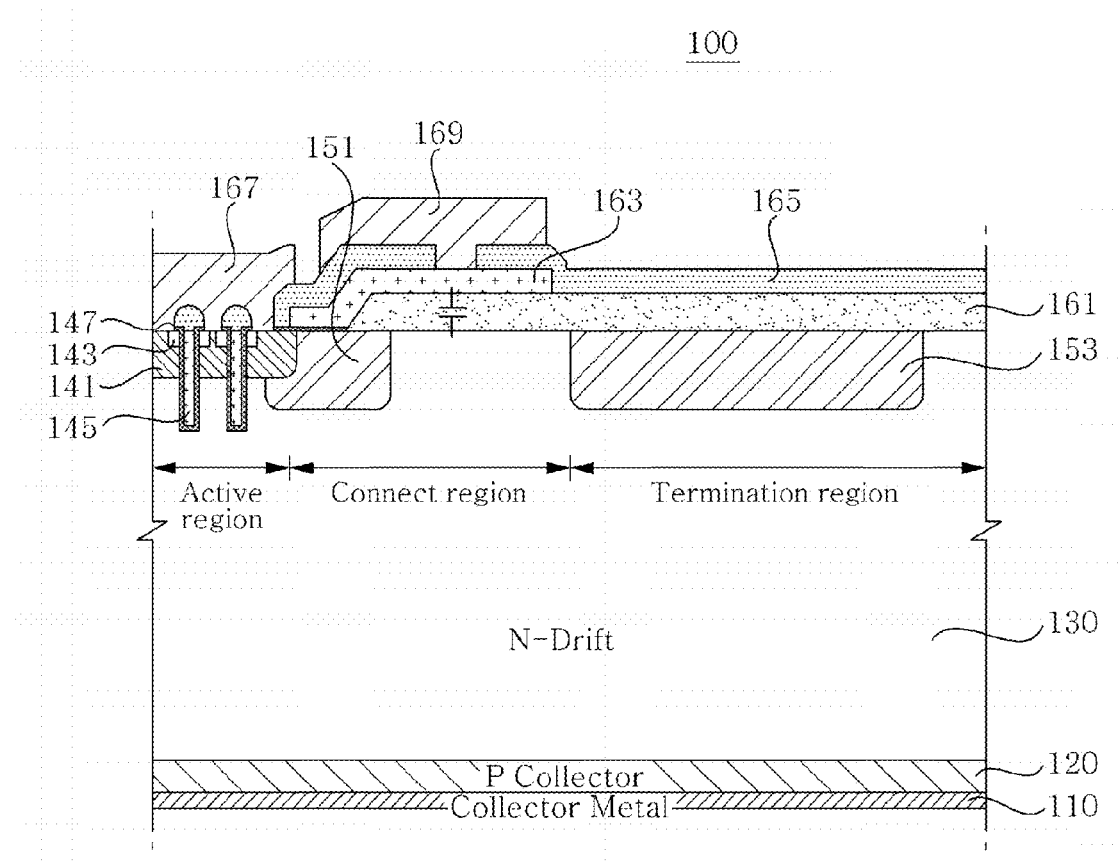
FIG. 1 is a cross-sectional view showing a configuration of a power semiconductor device according to an embodiment of the present invention.

The objects, features, and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side", and the like are used to differentiate a certain component from other components, but the configuration of such components should not be construed to be limited by the terms.

Hereinafter, preferred embodiments of the present invention will be described in detail with reference to the attached drawings.

Power Semiconductor Device

Figure 2:
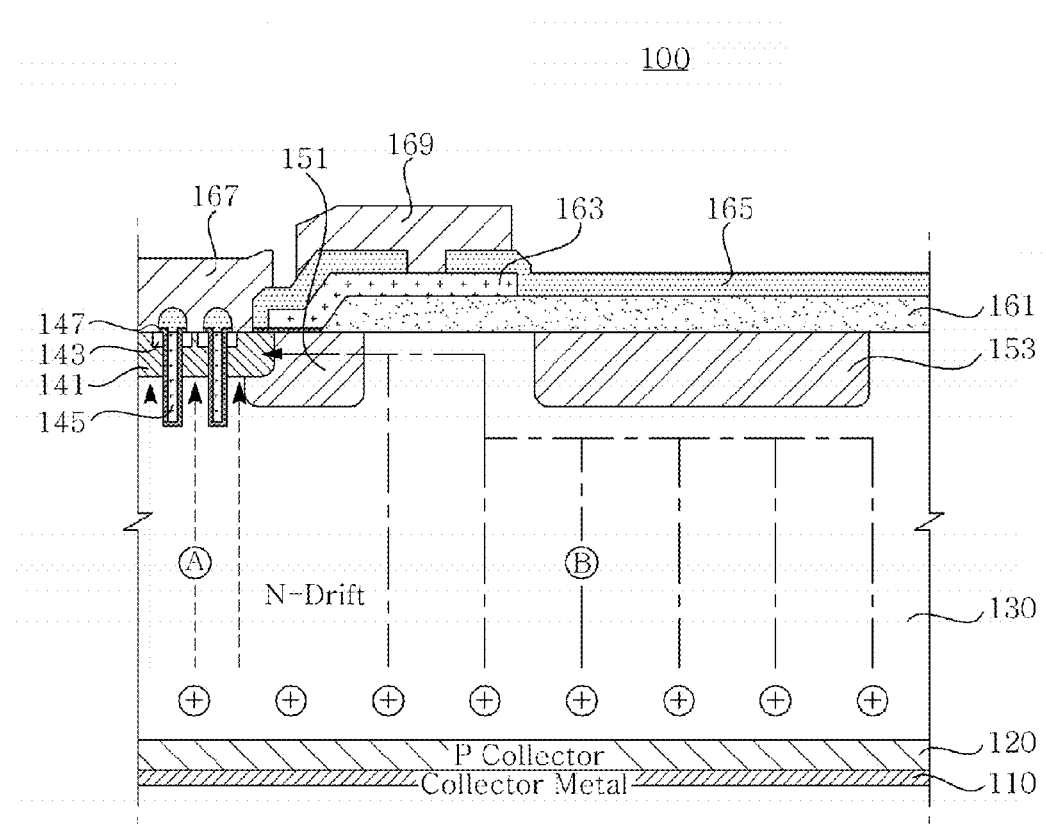
FIG. 2 is a cross-sectional view showing a hole movement path of the power semiconductor device of FIG. 1.
Figure 3:
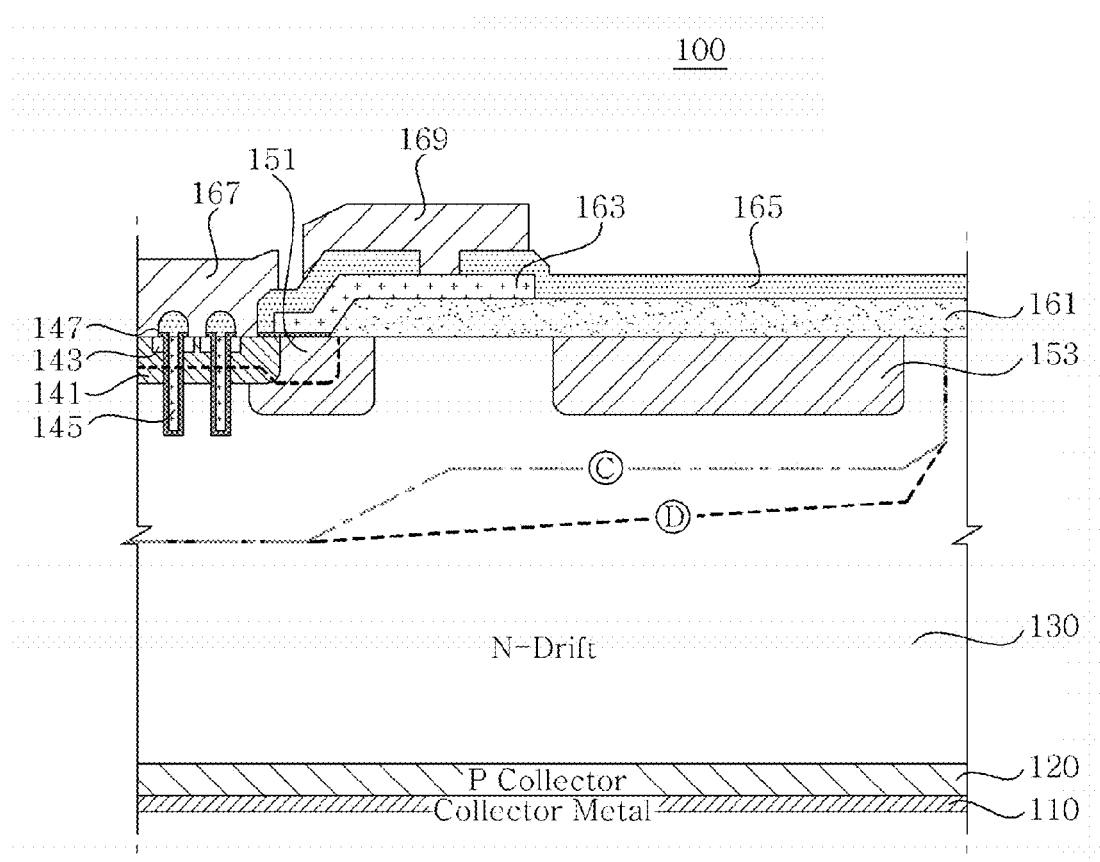
FIG. 3 is a cross-sectional view showing a structure of a depletion layer of the power semiconductor device of FIG. 1.
Figure 4:
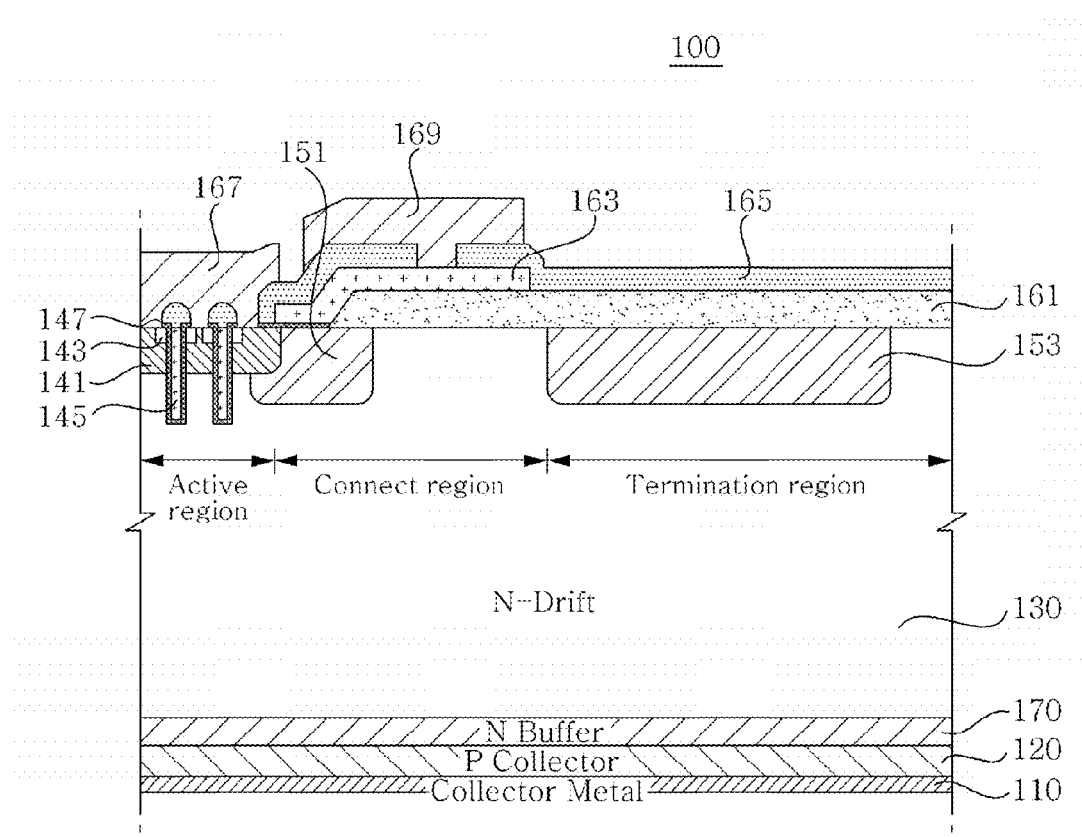
FIG. 4 is a cross-sectional view showing a configuration of a power semiconductor device according to another embodiment of the present invention.

FIG. 1 is a cross-sectional view showing a configuration of a power semiconductor device according to an embodiment of the present invention, FIG. 2 is a cross-sectional view showing a hole movement path of the power semiconductor device of FIG. 1, FIG. 3 is a cross-sectional view showing a structure of a depletion layer of the power semiconductor device of FIG. 1, and FIG. 4 is a cross-sectional view showing a configuration of a power semiconductor device according to another embodiment of the present invention.

As shown in FIGS. 1 to 3, the power semiconductor device 100 may include a first conductive type drift layer 130 that includes one surface and the other surface, and is divided into an active region, a connection region, and a termination region, a second conductive type semiconductor substrate 120 that is formed on the other surface of the first conductive type drift layer 130, a second conductive type well layer 141 that is formed with a predetermined depth in a thickness direction from the one surface of the first conductive type drift layer 130, and formed in the active region, a second conductive type first junction termination extension (JTE) layer 151 that is formed so as to be in contact with one side of the second conductive type well layer 141, a second conductive type second JTE layer 153 that is formed on the same line as the second conductive type first JTE layer 151, and is formed so as to be spaced apart from the second conductive type first JTE layer 151 in a length direction of the substrate, and a poly silicon layer 163 that is formed above the second conductive type well layer 141 and an upper portion of the second conductive type first JTE layer 151.

The first conductive type of the power semiconductor device according to an embodiment of the present invention may be an N-type, and the second conductive type thereof may be a P-type.

In addition, each of the second conductive type first JTE layer 151 and the second conductive type second JTE layer 153 may have a concentration lower than the second conductive type well layer 141.

In addition, as shown in FIG. 1, the poly silicon layer 163 may be formed so as to be closer to the second conductive type well layer 141 rather than the second conductive type second JTE layer 153 in the length direction of the substrate.

In addition, the power semiconductor device 100 may further include a first insulating layer 161 that is formed so as to be in contact over an area from an upper portion of the second conductive type first JTE layer 151 to an upper portion of the second conductive type second JTE layer 153.

In this instance, the poly silicon layer 163 may be formed above the second conductive type well layer 141 and the upper portion of the second conductive type first JTE layer 151 and is formed so as to be in contact with an arbitrary area among a side surface and an upper surface of the first insulating layer 161.

That is, as shown in FIG. 1, the poly silicon layer 163 may be formed in a shape of climbing from one side of the first insulating layer 161 to an upper surface thereof.

In addition, as shown in FIG. 1, in the power semiconductor device 100 according to an embodiment of the present invention, the first insulating layer 161 is inserted into a lower portion of the poly silicon layer 163 in comparison with an existing structure, and therefore an effect of reducing a capacitance between a first electrode 169 (for example, a gate electrode) and a second electrode 167 (for example, an emitter electrode) may be expected. That is, a parasitic capacitance may be reduced.

In addition, the second conductive type second JTE layer 153 may be formed longer than the second conductive type first JTE layer 151 in the length direction of the substrate.

In this instance, a size of the second conductive type first JTE layer 151 is fixed, but a size of the second conductive type second JTE layer 153 may be changeable in accordance with a withstand voltage rating.

In addition, the power semiconductor device 100 may further include a trench 145 that is formed so as to pass through the second conductive type well layer 141 from one surface of the first conductive type drift layer 130 in a thickness direction while including the second conductive type well layer 141.

In addition, the power semiconductor device 100 may further include a second insulating layer 147 that is formed on the second conductive type well layer 141 and the second conductive type first JTE layer 151 while including an inner side surface of the trench 145.

In addition, the power semiconductor device 100 may further include a second electrode region 143 that is formed on the second conductive type well layer 141 and formed on both outer walls of the trench 145.

In addition, the power semiconductor device 100 may further include an upper portion of the trench 145 of one surface of the first conductive type drift layer 130 and the poly silicon layer 163 spaced apart from the upper portion of the trench in the length direction of the substrate, and includes an opening portion for forming the first electrode on the first insulating layer 161.

In addition, the power semiconductor device 100 may further include a second electrode 167 that includes the third insulating layer 165 on the upper portion side of the trench 145 and is formed on the one surface of the first conductive type drift layer 130.

In this instance, the second electrode 167 may be an emitter electrode.

In addition, the power semiconductor device 100 may further include a first electrode 169 that includes an opening portion for forming the first electrode of the third insulating layer 165, and is formed on an arbitrary area of an upper portion of the third insulating layer 165.

In this instance, the first electrode 169 may be a gate electrode.

In addition, the power semiconductor device 100 may further include a third electrode 110 that is formed on a lower surface of the second conductive type semiconductor substrate 120.

In this instance, the third electrode 110 may be a collector electrode.

As shown in FIG. 2, in the power semiconductor device 100 according to an embodiment of the present invention, a hole (+) is moved through a path A and a path B in an active region and a termination region. Unlike a general structure, in the power semiconductor device 100 according to an embodiment of the present invention, the second conductive type first JTE layer 151 and the second conductive type second JTE layer 153 are formed so as to be spaced apart from each other, and therefore a latch-up resistance is reduced, thereby suppressing an occurrence of latch-up.

That is, the power semiconductor device 100 according to an embodiment of the present invention has a structure in which the second conductive type first JTE layer 151 and the second conductive type second JTE layer 153 are spaced apart from each other, and therefore a hole path (a length direction path of the substrate) injected from the second conductive type semiconductor substrate 120 (for example, P collector) at the time of ON operation is reduced compared to a structure in which the second conductive type first JTE layer 151 and the second conductive type second JTE layer 153 are combined with each other, thereby reducing the latch-up resistance.

In this instance, the latch-up resistance is reduced by reducing the hole path which may reduce a latch-up resistance occurring in the second conductive type second JTE layer 153 spaced apart from the second conductive type first JTE layer 151.

In addition, as shown in FIG. 2, the power semiconductor device 100 according to an embodiment of the present invention has a structure in which the second conductive type second JTE layer 153 is spaced apart from the active region, and the poly silicon layer 163 is formed on the first insulating layer 161, and therefore a phenomenon in which an electric field is concentrated at an edge region of the active region which may cause a reduction in a withstand voltage may be prevented.

In this instance, the poly silicon layer 163 may be connected with the first electrode 169 (for example, a gate electrode), and a gate voltage when an off mode is generated always becomes 0 v, and therefore an expansion of a depletion layer (D of FIG. 3) may be achieved by pushing electrons of the first conductive type drift layer (N-drift) 130.

Referring to FIG. 3, a region C may denote a structure of a depletion layer of the first conductive type drift layer 130 before applying a field plate of the poly silicon layer, and a region D may denote a structure of a depletion layer of the first conductive type drift layer 130 when a structure of the poly silicon layer is changed.

Meanwhile, as shown in FIG. 4, the power semiconductor device 100 according to an embodiment of the present invention may further include a first conductive type buffer layer 170 that is formed between the first conductive type drift layer 130 and the second conductive type semiconductor substrate 120.

In the power semiconductor device 100 according to an embodiment of the present invention, a size of the power semiconductor device 100 may be reduced while maintaining a withstand voltage as is by the second conductive type second JTE layer 153 that is spaced apart from the second conductive type first JTE layer 151 and the structure of the poly silicon layer 163, and occurrence of latch-up resistance may be suppressed.

As described above, according to the embodiments of the present invention, the power semiconductor device is composed of a P-layer with a lower concentration than the P-type well layer, and adopts the first JTE and the second JTE spaced apart from each other, thereby preventing a latch-up phenomenon while maintaining a high withstand voltage.

Although the embodiments of the present invention have been disclosed for illustrative purposes, it will be appreciated that the present invention is not limited thereto, and those skilled in the art will appreciate that various modifications, additions, and substitutions are possible, without departing from the scope and spirit of the invention.

Accordingly, any and all modifications, variations, or equivalent arrangements should be considered to be within the scope of the invention, and the detailed scope of the invention will be disclosed by the accompanying claims.

What is claimed is:

1. A power semiconductor device comprising:
a first conductive type drift layer that includes one surface and the other surface, and is divided into an active region, a connection region, and a termination region;
a second conductive type semiconductor substrate that is formed on the other surface of the first conductive type drift layer;
a second conductive type well layer that is formed with a predetermined depth in a thickness direction from the one surface of the first conductive type drift layer, and formed in the active region;
a second conductive type first junction termination extension (JTE) layer that is formed to be in contact with one side of the second conductive type well layer;
a second conductive type second JTE layer that is formed to be spaced apart from the second conductive type first JTE layer in a length direction of the substrate;
a first insulating layer that is formed to be in contact over an area from an upper portion of the second conductive type first JTE layer to an upper portion of the second conductive type second JTE layer;
a poly silicon layer that is formed above the second conductive type well layer and an upper portion of the second conductive type first JTE layer and is formed to be in contact with an arbitrary area among a side surface and an upper surface of the first insulating layer;
a trench that is formed to pass through the second conductive type well layer in a thickness direction from one surface of the first conductive type drift layer while including the second conductive type well layer; and
a second insulating layer that is formed on the second conductive type well layer on an inner side surface of the trench and the second conductive type first JTE layer while including an inner side surface of the trench,
wherein the second conductive type second JTE layer is formed longer than the second conductive type first JTE layer in the length direction of the substrate.

2. The power semiconductor device as set forth in claim 1, wherein the second conductive type first JTE layer and the second conductive type second JTE layer have a concentration lower than the second conductive type well layer.

3. The power semiconductor device as set forth in claim 1, wherein the poly silicon layer is formed so as to be closer to the second conductive type well layer rather than the second conductive type second JTE layer in the length direction of the substrate.

4. The power semiconductor device as set forth in claim 1, further comprising:
    a third electrode that is formed on a lower surface of the second conductive type semiconductor substrate.

5. The power semiconductor device as set forth in claim 1, further comprising:
    a first conductive type buffer layer that is formed between the first conductive type drift layer and the second conductive type semiconductor substrate.

6. The power semiconductor device as set forth in claim 1, wherein the first conductive type is an N-type, and the second conductive type is a P-type.

7. The power semiconductor device as set forth in claim 1, wherein the poly silicon layer is formed to be in contact with the side surface and the upper surface of the first insulating layer.

8. The power semiconductor device as set forth in claim 1, further comprising:
    a second electrode region that is formed on the second conductive type well layer and formed on both outer walls of the trench;
    a third insulating layer that is formed on an upper portion of the trench and the poly silicon layer spaced apart from the upper portion of the trench in the length direction of the substrate, and includes an opening portion on the poly silicon layer; and
    a second electrode that is formed above the one surface on the first conductive type drift layer and contacts the third insulating layer.

9. The power semiconductor device as set forth in claim 8, further comprising:
    a first electrode that includes an opening portion of the third insulating layer for forming the first electrode, and is formed on an arbitrary area of an upper portion of the third insulating layer.

\* \* \* \* \*